(12) United States Patent
Park et al.

(10) Patent No.: US 8,078,126 B2
(45) Date of Patent: Dec. 13, 2011

(54) COMMUNICATION APPARATUS AND LOW NOISE AMPLIFYING METHOD

(75) Inventors: Jae-woo Park, Yongin-si (KR); Chang-sik Yoo, Yongin-si (KR); Jin-soo Park, Yongin-si (KR); Heung-bae Lee, Seongnam-si (KR); Young-eil Kim, Suwonin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1248 days.

(21) Appl. No.: 11/733,401

(22) Filed: Apr. 10, 2007

(65) Prior Publication Data

US 2008/0113682 A1    May 15, 2008

(30) Foreign Application Priority Data

Nov. 15, 2006   (KR) .................. 10-2006-0112936

(51) Int. Cl.
  *H04B 1/06* (2006.01)
  *H04B 7/00* (2006.01)
(52) U.S. Cl. ............... 455/232.1; 455/240.1; 455/248.1; 455/250.1; 455/234.1
(58) Field of Classification Search ............... 455/552.1, 455/248.1, 250.1, 251.1, 276.1, 277.1, 277.2, 455/286, 289, 319–320, 333, 340–341, 63.1, 455/63.3, 67.11, 67.13, 107, 126, 127.2, 455/168.1, 197.2, 232.1, 240.1
See application file for complete search history.

(56) References Cited

U.S. PATENT DOCUMENTS

| | | | | |
|---|---|---|---|---|
| 6,112,062 A * | 8/2000 | Hans et al. | ................. | 455/114.3 |
| 6,677,821 B2 * | 1/2004 | Kusunoki et al. | ............. | 330/149 |
| 7,157,966 B2 * | 1/2007 | Baree et al. | ..................... | 330/133 |
| 7,292,103 B2 * | 11/2007 | Park et al. | ...................... | 330/280 |
| 7,512,386 B2 * | 3/2009 | Kalajo et al. | ................ | 455/127.1 |
| 7,622,845 B2 * | 11/2009 | Micko | ....................... | 310/316.01 |
| 2007/0232241 A1 * | 10/2007 | Carley et al. | .................... | 455/83 |
| 2009/0195316 A1 * | 8/2009 | Park et al. | ...................... | 330/277 |
| 2010/0124890 A1 * | 5/2010 | Schwarzmueller et al. | .. | 455/123 |
| 2010/0321110 A1 * | 12/2010 | Ichitsubo et al. | ............. | 330/144 |

FOREIGN PATENT DOCUMENTS

| KR | 2002-19466 | 3/2002 |
|---|---|---|
| WO | WO 01/82473 | 11/2001 |

OTHER PUBLICATIONS

Office Action issued in corresponding Korean Patent Application No. 2006-0112936 dated Nov. 1, 2007.

* cited by examiner

*Primary Examiner* — Pablo Tran

(74) *Attorney, Agent, or Firm* — NSIP Law

(57) ABSTRACT

A communication apparatus and a low noise amplifying method. The communication apparatus includes a gain adjusting unit to adjust a gain of an input signal; a combiner to generate an output signal using the signal gain-adjusted at the gain adjusting unit; and a feedback unit which provides a feedback signal, which is generated using the output signal generated at the combiner, to an input stage. Accordingly, various frequency bands defined in the wireless standards can be supported. Since the load impedance is generated without resistance, the manufacturing cost and the product size can be reduced.

20 Claims, 4 Drawing Sheets

COMMUNICATION APPARATUS AND LOW NOISE AMPLIFYING METHOD

CROSS-REFERENCE TO RELATED APPLICATIONS

This application claims all benefits accruing under 35 U.S.C. §119 from Korean Patent Application No. 2006-112936, filed on Nov. 15, 2006 in the Korean Intellectual Property Office, the entire disclosure of which is incorporated herein by reference.

BACKGROUND OF THE INVENTION

1. Field of the Invention

Aspects of the present invention relate to communication and low noise amplification. More particularly, aspects of the present invention relate to a communication apparatus and a low noise amplifying method, which can reduce a noise figure in a frequency band to be used and can increase circuit integration using a source floor feedback operable at a low voltage in a low noise amplifier structure.

2. Description of the Related Art

The complementary metal-oxide-semiconductor (CMOS) technique is generally used to implement a system-on-a-chip (SoC), because the CMOS technique allows for smaller chips. With smaller chip sizes, better RF performance can be achieved.

Recently, different radio communication standards have emerged, and development of radio communication devices based on the various wireless communication standards is under way. However, usually radio communication devices only support the frequency bands of the wireless communication standards that the device uses. Thus, what is needed is a wireless communication device able to support multiple frequency bands based on a plurality of wireless communication standards so as to support various wireless communication services. Specifically, what is needed is a multiband wireless communication device which can support various frequency bands that are used prevalently, such as WCDMA, CDMA2000, Wibro, Bluetooth, Zigbee, and WLAN, in a single device.

Research and development has recently been conducted on RF-front-end schemes to support multiple frequency bands defined in the plurality of the wireless standards. One of the schemes is a parallel RF-front-end scheme. The parallel RF-front-end scheme employs as many low noise amplifiers (LNAs) and mixers as the number of frequency bands defined in the plurality of the wireless standards supported by the wireless communication device. However, as the device supports more wireless standards, the number of amplifiers and mixers increases, thus increasing the manufacturing cost and the product size of the wireless communication device.

Another scheme for supporting the various frequency bands defined in the plurality of the wireless standards is a reconfigurable mixer scheme. The reconfigurable mixer scheme employs one mixer and a plurality of LNAs to support the plurality of the wireless standards. Disadvantageously, the increased number of LNAs raises the manufacturing cost and increases the product size.

SUMMARY OF THE INVENTION

Aspects of the present invention relate to a multimode/multiband communication apparatus and a low noise amplifying method, which can support various frequency bands defined in a plurality of wireless standards, lower a manufacture cost, and decrease a product size.

Additional aspects and/or advantages of the invention will be set forth in part in the description which follows and, in part, will be obvious from the description, or may be learned by practice of the invention.

According to an aspect of the present invention, there is provided a communication apparatus including a gain adjusting unit to adjust a gain of an input signal from an input unit; a combiner to generate an output signal using the gain-adjusted signal; and a feedback unit to provide, to the input unit, a feedback signal generated using the output signal generated at the combiner.

According to another aspect of the invention, the communication apparatus further includes the input unit, wherein the input unit is an input matching unit to generate an input impedance using the feedback signal.

According to another aspect of the invention, the input impedance generated at the input matching unit is expressed as the following equation:

$$Z_{in} = \frac{1}{gm_3(1 + gm_1 Z_L)} \approx \frac{1}{gm_3 gm_1 Z_L}$$

where $Z_{in}$ is the input impedance, $gm_3$ is a conductance of a transistor in the feedback unit, $gm_1$ is a conductance of another transistor in the gain adjusting unit, and $Z_L$ is a load impedance.

According to an aspect of the invention, a noise figure of the output signal is expressed as the following equation:

$$NF \approx 1 + \gamma \frac{1}{gm_1}\left(\frac{1}{R_S} + \frac{1}{Z_L}\right)$$

where NF is the noise figure, $\gamma$ is a predefined constant, $R_S$ is a source resistance included in the input matching unit, $gm_1$ is a conductance of a transistor in the gain adjusting unit, and $Z_L$ is a load impedance.

According to another aspect of the invention, the communication apparatus further includes a separating element interposed between the gain adjusting unit and the feedback unit to separate the feedback signal into an alternating current (AC) component and a direct current (DC) component and to provide the AC component of the feedback signal to the gain adjusting unit.

According to another aspect of the invention, the separating element is an AC coupling capacitor.

According to another aspect of the invention, the communication apparatus further includes an output matching unit to generate and output a load impedance. The combiner generates the output signal by combining the gain-adjusted signal with a signal applied to the load impedance.

According to another aspect of the invention, the output matching unit generates the load impedance using an inductor, at least one capacitor, and at least one switch.

According to another aspect of the invention, the output matching unit generates different load impedances according to a plurality of frequency bands using at least one of the switches.

According to an aspect of the invention, the combiner uses the different load impedances to generate different output signals according to the plurality of the frequency bands.

According to another aspect of the present invention, a low noise amplifying method includes adjusting a gain of an input signal received from an input unit; generating an output signal using the gain-adjusted signal; and providing a feedback signal, which is generated using the generated output signal, to the input unit.

According to another aspect of the invention, the low noise amplifying method further includes generating an input impedance using the feedback signal.

According to another aspect of the invention, the generated input impedance is expressed as the following equation:

$$Z_{in} = \frac{1}{gm_3(1 + gm_1 Z_L)} \approx \frac{1}{gm_3 gm_1 Z_L}$$

where $Z_{in}$ is the input impedance, $gm_3$ is a conductance of a transistor used to generate the feedback signal, $gm_1$ is a conductance of another transistor used to adjust the gain of the input signal, and $Z_L$ is a load impedance.

According to another aspect of the invention, a noise figure of the output signal is expressed as the following equation:

$$NF \approx 1 + \gamma \frac{1}{gm_1}\left(\frac{1}{R_S} + \frac{1}{Z_L}\right)$$

where NF is the noise figure, $\gamma$ is a predefined constant, $R_S$ is a source resistance included in an input matching unit, $gm_1$ is a conductance of a transistor used to adjust the gain of the input signal, and $Z_L$ is a load impedance.

According to another aspect of the invention, the low noise amplifying method further includes separating an alternating current (AC) component and a direct current (DC) component and adjusting the gain of the input signal using the AC component of the feedback signal.

According to another aspect of the invention, the separating operation uses an AC coupling capacitor.

According to another aspect of the invention, the low noise amplifying method further includes generating and outputting a load impedance, wherein the generating of the output signal comprises y combining the gain-adjusted signal with a signal applied to the load impedance.

According to another aspect of the invention, the generating of the output signal comprises generating the load impedance using an inductor, at least one capacitor, and at least one switch.

According to another aspect of the invention, the generating of the output signal comprises generating different load impedances according to a plurality of frequency bands using at least one of the switches.

According to another aspect of the invention, the generating of the output signal comprises generating different output signals according to the plurality of the frequency bands using the different load impedances.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
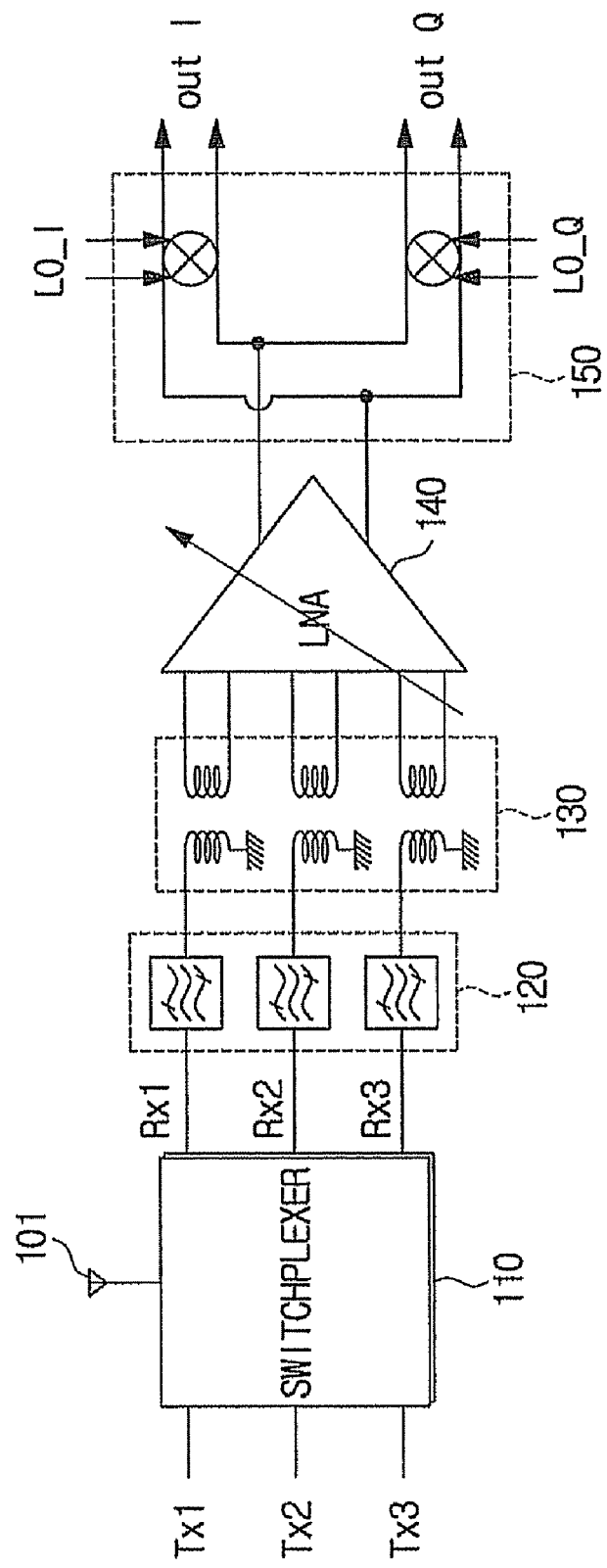
FIG. 1 is a block diagram of a communication apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram of a communication apparatus according to an embodiment of the present invention. The communication apparatus includes a switchplexer 110, a filter 120, a transformer 130, a low noise amplifier (LNA) 140, and a mixer 150. The switchplexer 110 separates a plurality of multiband signals received via an antenna 101 based on their frequency bands. The filter 120 filters and outputs only signals of the intended frequency band from the signals separated at the switchplexer 110. The filter 120 may be a band pass filter (BPF) having band pass characteristics; however, according to other aspects of the invention, any kind of filter may be used. The transformer 130 adjusts the voltage of the signals fed from the filter 120 to a preset reference voltage. The LNA 140 amplifies and outputs the signals fed from the transformer 130. The LNA 140 amplifies the signals while reducing a noise figure of the received signals.

The mixer 150 converts the frequency of the signals fed from the LNA 140 to a baseband frequency of the standard to be used. The mixer 150 down-converts the frequency of the received signals to the baseband frequency. The standard to be used may a wireless standard, such as WCDMA, CDMA2000, Wibro, Bluetooth, Zigbee, and WLAN; however, other aspects of the invention may support other standards.

Figure 2:
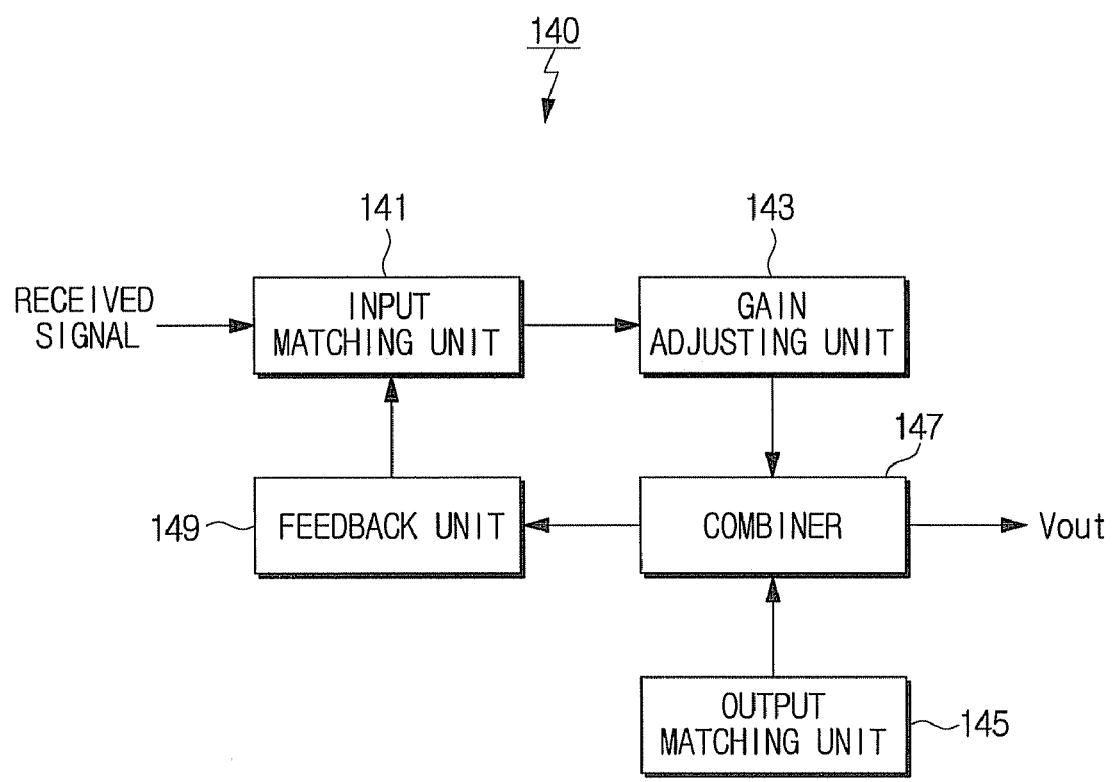
FIG. 2 is a block diagram of a low noise amplifier (LNA) according to an embodiment of the present invention.

FIG. 2 is a block diagram of an LNA according to an embodiment of the present invention. The LNA 140 includes an input matching unit 141, a gain adjusting unit 143, an output matching unit 145, a combiner 147, and a feedback unit 149.

The input matching unit 141 outputs the signals received over the antenna 101 without signal attenuation using an input impedance $Z_{in}$. The input matching unit 141 determines and outputs the input impedance $Z_{in}$ using a current $i_{DS3}$ fed from the feedback unit 149, which is explained below, and a preset test voltage $V_T$. The gain adjusting unit 143 adjusts the gain of the signal fed from the input matching unit 141. The gain adjusting unit 143 outputs a gain-adjusted signal using the conductance and the voltage of the fed signal. The gain-adjusted signal may be, but is not limited to, a drain current $i_{D1}$ which is generated by a voltage difference between the gate and the source of a transistor M1.

The output matching unit 145 generates a load impedance $Z_L$ using a resistor (R), an inductor (L), and a capacitor (C) in an RLC parallel circuit. The output matching unit 145 generates and outputs the highest load impedance $Z_L$ in the band to be used by the communication apparatus.

The combiner 147 determines the output signal by combining the signal gain-adjusted at the gain adjusting unit 143 and the signal applied to the load impedance at the output matching unit 145. The combiner 147 determines the output signal by combining the current $i_{D1}$ fed from the gain adjusting unit 143 with the load impedance $Z_L$ fed from the output matching unit 145. Specifically, the combiner 147 determines the output signal as the product of the fed current $i_{D1}$ and the fed load impedance $Z_L$ and applies the determined output signal to the feedback unit 149. The output signal may be an output voltage $V_{out}$; however, other aspects of the invention may have another type of output signal.

The feedback unit 149 generates a feedback signal using the output signal fed from the combiner 147 and applies the generated feedback signal to the input matching 141. Specifically, the feedback unit 149 provides the input matching unit 141 with a current $i_{DS3}$ generated by the voltage difference between the gate and the source. The feedback unit 149 is described in more detail in the circuit diagram of FIG. 3.

Figure 3:
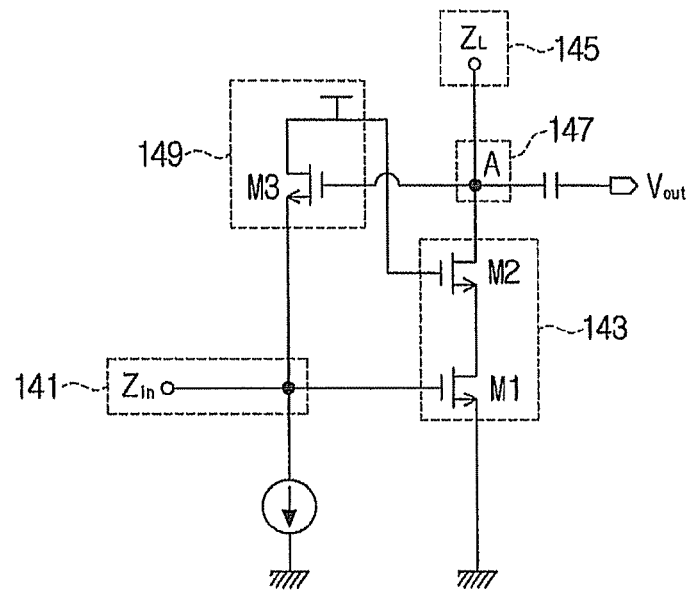
FIG. 3 is a circuit diagram of the LNA according to an embodiment of the present invention.

FIG. 3 is a circuit diagram of the LNA according to one embodiment of the present invention. The input matching unit 141 determines and outputs the input impedance $Z_{in}$ using a preset test current $I_T$ and the preset test voltage $V_T$.

At the spot where the input impedance $Z_{in}$ and the transistors M1 and M3 join, the test voltage $v_T$ is the gate voltage ($v_{G1}=v_T$) of the transistor M1 and the source voltage ($v_{S3}=v_T$) of the transistor M3, respectively.

As the source of the transistor M1 is connected to the ground, the gate-source voltage $v_{GS1}$ of the transistor M1 is equal to the gate voltage $v_{G1}$ of the transistor M1. Since the gate voltage $v_{G1}$ of the transistor M1 is the test voltage $v_T$, the gate-source voltage $v_{GS1}$ of the transistor M1 becomes equal to the test voltage $v_T$.

Next, the transistor M1 converts the gate-source voltage $v_{GS1}$ to a drain current $-i_{D1}$ and outputs the drain current $-i_{D1}$. The drain current $-i_{D1}$ of the transistor M1 is the product ($gm_1*v_T$) of a conductance $gm_1$ and the gate-source voltage ($v_{GS1}=v_T$) of the transistor M1. The transistor M2 provides the drain current $-i_{D1}$ fed from the transistor M1 to the combiner 147. The transistor M2 forwards the drain current $-i_{D1}$ fed from the transistor M1 toward the load impedance $Z_L$.

The combiner 147 determines the output voltage $v_{out}=-i_{D1}*Z_L=-gm_1*v_T*Z_L$ as the product of the drain current $i_{D1}$ of the transistor M1 and the load impedance $Z_L$ after passing through the transistor M2. The output voltage $v_{out}=-gm_1*v_T*Z_L$ is determined at the spot A where the load impedance $Z_L$ the transistor M2, the transistor M3, and a capacitor connected to the output voltage $v_{out}$ join. Next, the combiner 147 forwards the determined output voltage $v_{out}=-gm_1*v_T*Z_L$ to the transistor M3. Accordingly, the gate voltage $v_{G3}$ of the transistor M3 is the output voltage $v_{out}=-gm_1*v_T*Z_L$.

The voltage difference between the source voltage $v_{S3}=v_T$ and the gate voltage $v_{G3}=-gm_1*v_T*Z_L$ of the transistor M3 causes a drain-source current $i_{DS3}$. The drain-source current $i_{DS3}$ of the transistor M3 is the product $(-gm_1*v_T*Z_L-v_T)*gm_3$ of the voltage difference $v_{G3}-v_{S3}=-gm_1*v_T*Z_L-v_T$ between the source voltage $v_{S3}=v_T$ and the gate voltage $v_{G3}=-gm_1*v_T*Z_L$ of the transistor M3 and a conductance $gm_3$. The feedback unit 149 provides the determined drain-source current $i_{DS3}$ of the transistor M3 to the input matching unit 141.

The input matching unit 141 determines an input impedance $Z_{in}=v_T/i_{DS3}$ using the drain-source current $i_{DS3}$ of the transistor M3 and the test voltage $v_T$, and provides the determined input impedance to the transistors M1 and M3. The determined input impedance $Z_{in}$ may be expressed as Equation 1.

$$Z_{in} = \frac{1}{gm_3(1+gm_1 Z_L)} \approx \frac{1}{gm_3 gm_1 Z_L} \quad \text{[Equation 1]}$$

In Equation 1, $Z_{in}$ is the input impedance, $gm_3$ and $gm_1$ is the conductance of the transistors M3 and M1, respectively, and $Z_L$ is the load impedance. In the event of a sufficiently large $gm_1$, the value '1' in $1+gm_1 Z_L$ becomes negligible. Thus, $1+gm_1 Z_L$ and $gm_1 Z_L$ can be used interchangeably.

The noise figure of the LNA 140 is expressed as Equation 2.

$$NF \approx 1 + \gamma \frac{1}{gm_1}\left(\frac{1}{R_S}+\frac{1}{Z_L}\right) \quad \text{[Equation 2]}$$

In Equation 2, NF is the noise figure, $\gamma$ is a predefined constant, and $R_S$ is a preset source resistance included in the input matching unit 141. The noise figure can be lowered by adjusting the load impedance $Z_L$. Namely, the noise figure NF can be lowered by increasing the load impedance $Z_L$.

Figure 4:
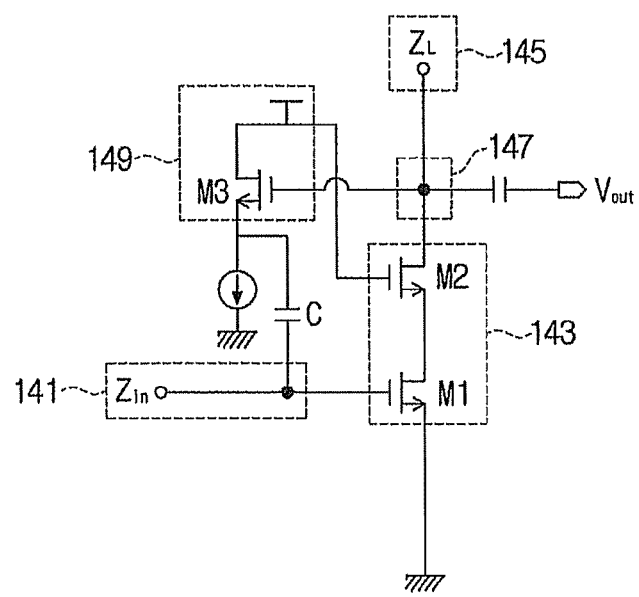
FIG. 4 is a circuit diagram of an LNA according to another embodiment of the present invention.

FIG. 4 is a circuit diagram of an LNA according to another embodiment of the present invention. The DC voltage of a transistor M1 can be regulated by interconnecting a capacitor C between a source of a transistor M3 and a gate of the transistor M1. The capacitor acts as a separating element to separate the AC component of the feedback signal and the DC component of the feedback signal. Using the capacitor C disposed between the feedback 149 and the gain adjusting unit 143, only the AC component of the feedback signal is applied to the transistor M1 and only the AC voltage output from the transistor M1 is fed back to the transistor M3. Therefore, the DC voltage of the transistor M1 can be regulated. It is possible to control not only the load impedance $Z_L$ but also the trans-conductance $gm_1$ of the transistor M1. The noise figure NF can be lowered by adjusting at least one of the trans-conductance $gm_1$ of the transistor M1 and the load impedance $Z_L$ The capacitor C be an AC coupling capacitor; however, other aspects of the present invention may use other types of capacitors.

Figure 5:
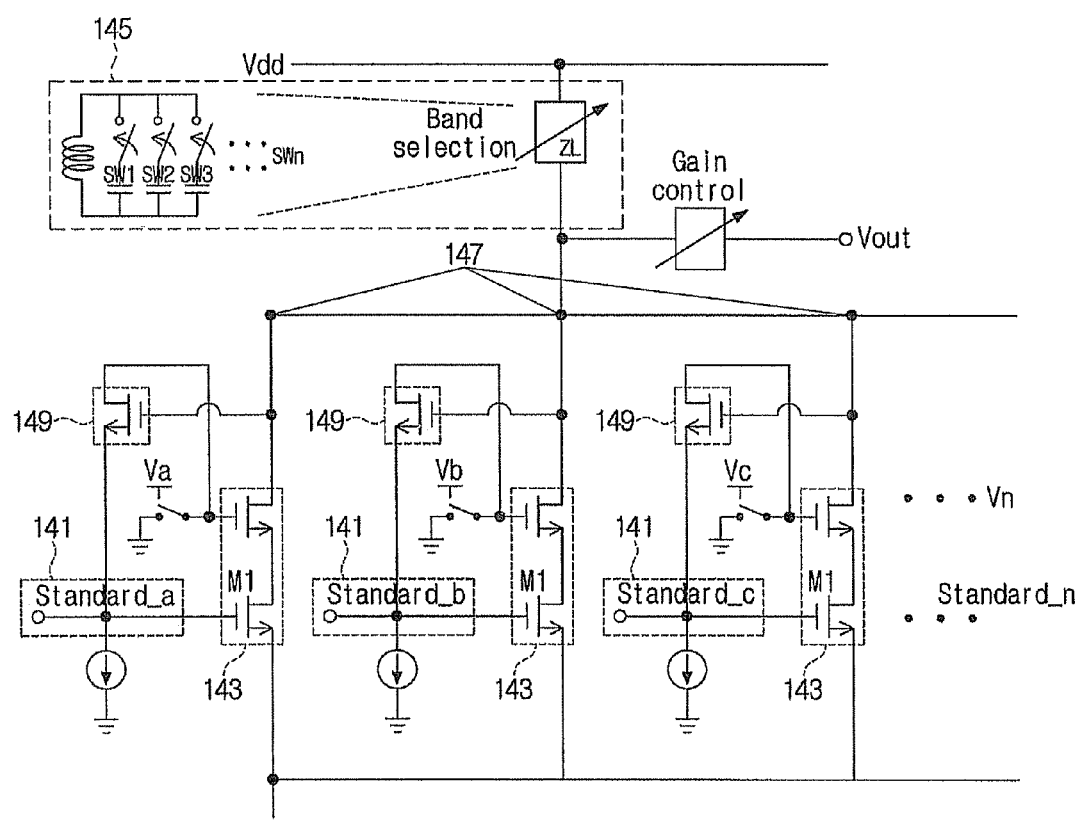
FIG. 5 is a circuit diagram of an LNA according to still another embodiment of the present invention.

FIG. 5 is a circuit diagram of an LNA according to still another embodiment of the present invention. An output matching unit 145 generates and outputs a different load impedance $Z_L$ depending on a plurality of frequency bands.

The output matching unit 145 generates the optimum load impedance $Z_L$ in the respective frequency bands using an inductor, at least one capacitor, and at least one switch. Resistance and capacitance values are predefined to generate the optimum load impedance $Z_L$ in the respective frequency bands. The output matching unit 145 generates the load impedance $Z_L$ by connecting to the switch corresponding to the frequency band of the received signal. A first switch sw1 and A second switch sw2 are switched to the inductor and the capacitor that generate the load impedance $Z_L$ in 1.6 GHz and 5 GHz, respectively. When the frequency band to be used by the communication apparatus is 1.6 GHz, the output matching unit 145 turns on the first switch sw1 to generate the optimum load impedance $Z_L$ in the 1.6 GHz band. The particular frequency bands used may depend on the particular wireless communications standards supported by the communication apparatus. Accordingly, other aspects of the present invention may generate the load impedance $Z_L$ in other frequencies.

A combiner 147 selects a circuit block Va through Vn corresponding to the load impedance $Z_L$ fed from the output matching unit 145. Specifically, the combiner 147 selects a circuit block, to which the load impedance $Z_L$ fed from the output matching unit 145 is input, from a plurality of circuit blocks, and turns on the switch Va, Vb, Vc, . . . Vn of the selected circuit block. The plurality of the circuit blocks is designed so as to minimize the noise figure NF in the plurality of the frequency bands defined in the plurality of the wireless communication standards, respectively.

To simplify understanding of aspects of the present invention, it has been explained that the output match unit 145 of the LNA according to an embodiment of the present invention generates the load impedance $Z_L$ by turning on one of the switches sw1 through swn. According to other aspects of the invention, the output matching unit 145 may be able to generate the load impedance $Z_L$ using at least one (one or more) of the switches sw1 through swn.

In the LNA according to another embodiment of the present invention, while the combiner 147 may, as shown in FIG. 5, have a plurality of the circuit blocks to which the load impedance $Z_L$ is input, the combiner 147 may also use a single circuit block.

As described above, according to aspects of the present invention, various frequency bands defined in the wireless standards can be supported. Since the load impedance is generated without resistance, the manufacture cost and the product size can be decreased. As such, aspects of the present invention may be used in mobile devices, such as notebook computers, personal digital assistants, mobile phones, personal entertainment devices, or multi-function devices.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A communication apparatus comprising:
a gain adjusting unit configured to adjust a gain of an input signal from an input unit;
an output matching unit configured to generate and output a load impedance;
a combiner configured to generate an output signal by combining the gain-adjusted input signal with a signal applied to the load impedance; and
a feedback unit configured to provide, to the input unit, a feedback signal generated using the output signal generated at the combiner,
wherein the gain adjusting unit comprises a plurality of transistors, at least one of the transistors is connected to the feedback unit and at least one of the transistors is connected to the input unit.

2. The communication apparatus of claim 1, further comprising:
the input unit, wherein the input unit comprises an input matching unit configured to generate an input impedance using the feedback signal.

3. The communication apparatus of claim 2, wherein the input impedance generated at the input matching unit is expressed as the following equation:

$$Z_{in} = \frac{1}{gm_3(1+gm_1 Z_L)} \approx \frac{1}{gm_3 gm_1 Z_L}$$

where $Z_{in}$ is the input impedance, $gm_3$ is a conductance of a transistor in the feedback unit, $gm_1$ is a conductance of another transistor in the gain adjusting unit, and $Z_L$ is a load impedance.

4. The communication apparatus of claim 1, wherein a noise figure of the output signal is expressed as the following equation:

$$NF \approx 1 + \gamma \frac{1}{gm_1}\left(\frac{1}{R_S} + \frac{1}{Z_L}\right)$$

where NF is the noise figure, $\gamma$ is a predefined constant, $R_S$ is a source resistance included in the input matching unit, $gm_1$ is a conductance of a transistor in the feedback unit, and $Z_L$ is a load impedance.

5. The communication apparatus of claim 1, further comprising:
a separating element interposed between the gain adjusting unit and the feedback unit configured to separate the feedback signal into an alternating current (AC) component and a direct current (DC) component and to provide the AC component of the feedback signal to the gain adjusting unit.

6. The communication apparatus of claim 5, wherein the separating element comprises an AC coupling capacitor.

7. The communication apparatus of claim 1, wherein the output matching unit generates the load impedance using an inductor, at least one capacitor, and at least one switch.

8. The communication apparatus of claim 7, wherein the output matching unit generates different load impedances according to a plurality of frequency bands using at least one of the switches.

9. The communication apparatus of claim 8, wherein the combiner uses the different load impedances to generate different output signals according to the plurality of the frequency bands.

10. A low noise amplifying method comprising:
adjusting, by a gain adjusting unit, a gain of an input signal received from an input unit;
generating and outputting a load impedance;
generating an output signal by combining the gain-adjusted input signal with a signal applied to the load impedance; and
providing, by a feedback unit, a feedback signal, which is generated using the generated output signal, to the input unit,
wherein the gain adjusting unit comprises a plurality of transistors, at least one of the transistors is connected to the feedback unit and at least one of the transistors is connected to the input unit.

11. The low noise amplifying method of claim 10, further comprising:
generating an input impedance using the feedback signal.

12. The low noise amplifying method of claim 11, wherein the generated input impedance is expressed as the following equation:

$$Z_{in} = \frac{1}{gm_3(1+gm_1 Z_L)} \approx \frac{1}{gm_3 gm_1 Z_L}$$

where $Z_{in}$ is the input impedance, $gm_3$ is a conductance of a transistor used to generate the feedback signal, and $gm_1$ is a conductance of another transistor used to adjust the gain of the input signal, and $Z_L$ is a load impedance.

13. The low noise amplifying method of claim 10, wherein a noise figure of the output signal is expressed as the following equation:

$$NF \approx 1 + \gamma \frac{1}{gm_1}\left(\frac{1}{R_S} + \frac{1}{Z_L}\right)$$

where NF is the noise figure, $\gamma$ is a predefined constant, $R_S$ is a source resistance included in an input matching unit, $gm_1$ is a conductance of a transistor used to adjust the gain of the input signal, and $Z_L$ is a load impedance.

14. The low noise amplifying method of claim 10, further comprising:
    separating the feedback signal into an alternating current (AC) component and a direct current (DC) component; and
    adjusting the gain of the input signal using the AC component of the feedback signal.

15. The low noise amplifying method of claim 14, wherein the separating operation uses an AC coupling capacitor.

16. The low noise amplifying method of claim 10, wherein the generating of the output signal comprises generating the load impedance using an inductor, at least one capacitor, and at least one switch.

17. The low noise amplifying method of claim 16, wherein the generating of the output signal comprises generating different load impedances according to a plurality of frequency bands using at least one of the switches.

18. The low noise amplifying method of claim 17, wherein the generating of the output signal comprises generating different output signals according to the plurality of the frequency bands using the different load impedances.

19. The communication apparatus of claim 1, wherein the combiner determines the output signal by combining current fed from the gain adjusting unit with the load impedance.

20. The communication apparatus of claim 19, wherein the combiner determines the output signal as the product of the current fed and the load impedance.

* * * * *